(12) United States Patent
Sawada et al.

(10) Patent No.: US 10,509,069 B2
(45) Date of Patent: Dec. 17, 2019

(54) INSPECTION DEVICE

(71) Applicant: FUJI CORPORATION, Chiryu-shi (JP)

(72) Inventors: Toshiyuki Sawada, Toyota (JP); Satoshi Iwashima, Chiryu (JP)

(73) Assignee: FUJI CORPORATION, Chiryu-shi (JP)

( * ) Notice: Subject to any disclaimer, the term of this patent is extended or adjusted under 35 U.S.C. 154(b) by 33 days.

(21) Appl. No.: 15/743,541

(22) PCT Filed: Jul. 15, 2015

(86) PCT No.: PCT/JP2015/070307
§ 371 (c)(1),
(2) Date: Jan. 10, 2018

(87) PCT Pub. No.: WO2017/009986
PCT Pub. Date: Jan. 19, 2017

(65) Prior Publication Data
US 2018/0203057 A1  Jul. 19, 2018

(51) Int. Cl.
*G01R 31/00* (2006.01)
*G01R 31/26* (2014.01)
(Continued)

(52) U.S. Cl.
CPC ....... *G01R 31/2601* (2013.01); *G01R 1/0416* (2013.01); *G01R 27/02* (2013.01)

(58) Field of Classification Search
CPC ............ G01R 31/26; G01R 31/2601; G01R 31/2813; G01R 31/2806; G01R 31/067;
(Continued)

(56) References Cited

U.S. PATENT DOCUMENTS

| | | | | |
|---|---|---|---|---|
| 4,794,689 A | * | 1/1989 | Seno | ............... H05K 13/082 29/740 |
| 2006/0255822 A1 | * | 11/2006 | Saito | ............... G01R 1/0458 324/750.09 |

(Continued)

FOREIGN PATENT DOCUMENTS

| | | |
|---|---|---|
| EP | 2 981 164 A1 | 2/2016 |
| JP | 52-30703 A | 8/1977 |

(Continued)

OTHER PUBLICATIONS

International Search Report dated Oct. 20, 2015, in PCT/JP2015/070307 filed Jul. 15, 2015.
(Continued)

*Primary Examiner* — Thang X Le
(74) *Attorney, Agent, or Firm* — Oblon, McClelland, Maier & Neustadt, L.L.P.

(57) ABSTRACT

After measuring electrical characteristics, a component favorably drops from a measuring element. An inspection device includes a pair of measuring elements configured to measure electrical characteristics of a component by gripping the components due to being capable of approaching and separating from each other; and air supply device configured to supply air to at least one of a pair of opposing surfaces that oppose each of the pair of measuring elements, and by supplying air to at least one of the opposing surfaces from air supply device, a component s adhered to the at least one opposing surface can be caused to drop favorably.

17 Claims, 10 Drawing Sheets

(51) Int. Cl.
*G01R 1/04* (2006.01)
*G01R 27/02* (2006.01)

(58) Field of Classification Search
CPC ........ G01R 1/04; G01R 1/0416; G01R 27/02; G01R 27/26; H05K 13/08; H05K 13/082; H05K 13/0408; H05K 13/0409; H05K 13/021
See application file for complete search history.

(56) References Cited

U.S. PATENT DOCUMENTS

| | | | | |
|---|---|---|---|---|
| 2013/0298391 | A1* | 11/2013 | Suzuki ................ | H05K 13/089 29/705 |
| 2013/0304249 | A1* | 11/2013 | Suzuki ................ | G05B 13/021 700/193 |
| 2016/0150687 | A1* | 5/2016 | Shibata ................ | H05K 13/08 700/121 |
| 2016/0150689 | A1* | 5/2016 | Amano ................ | H04N 5/2253 29/739 |

FOREIGN PATENT DOCUMENTS

| | | |
|---|---|---|
| JP | 1-76100 U | 5/1989 |
| JP | 2004-77238 A | 3/2004 |
| WO | WO 2014/155657 A1 | 10/2014 |

OTHER PUBLICATIONS

Extended European Search Report dated Jun. 19, 2018 in European Patent Application No. 15898298.3, 16 pages.

* cited by examiner (a)

(b)

(a) Initial state (c) Measurement state (b) Clamp state (d) Discard state ns mounted on a circuit board.

BACKGROUND ART

Disclosed in patent literature 2 and 3 is an inspection device provided with a probe that measures electrical characteristics of a component via contact with the probe. Disclosed in patent literature 1 is an inspection device that measures electrical characteristics of a component loaded on a holding table by sandwiching the component from both sides. In this inspection device, air is supplied from ventilation duct section 28 along a V-groove in the holding table, and a post-measurement component in the V groove is fed to introduction opening section 7'. Then, defective components are discarded and good components are used for mounting on a circuit board.

CITATION LIST

Patent Literature

Patent literature 1: JP-S52-30703
Patent literature 2: JP-U-H1-76100
Patent literature 3: WO2014/155657

BRIEF SUMMARY

Problem to be Solved

An object of the present disclosure is to make a component drop favorably from a measuring element after measurement of electrical characteristics in an inspection device capable of automatically measuring electrical characteristics of the component.

Means for Solving the Problem

An inspection device of the present disclosure includes: a pair of measuring elements configured to measure electrical characteristics of a component by gripping the components due to being capable of approaching and separating from each other; and an air supply device configured to supply air to at least one of a pair of opposing surfaces that oppose each of the pair of measuring elements. Because the air supply device supplies air to at least one of the pair of opposing surfaces, a component adhering to the opposing surface can be caused to drop favorably.

BRIEF DESCRIPTION OF DRAWINGS

FIG. 9(a) shows an initial state;
FIG. 9(b) shows a clamped state;
FIG. 9(c) shows a measurement state;
and FIG. 9(d) shows a discard state.

DETAILED DESCRIPTION

Figure 1:
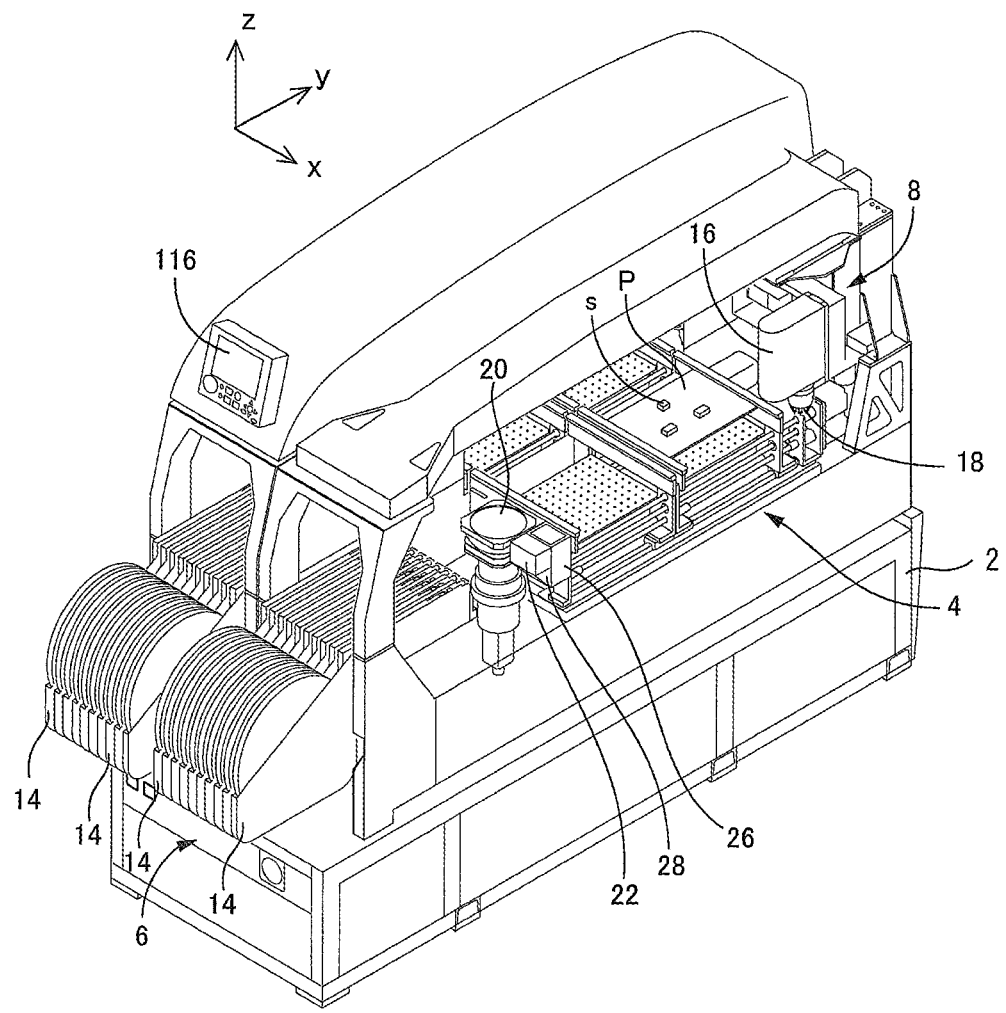
FIG. 1 is a perspective view of a mounting machine including an inspection device that is an embodiment of the present disclosure.

A mounting machine including an inspection device that is an embodiment of the present disclosure is described below in detail with reference to the figures. The mounting machine shown in FIG. 1 is for mounting components on a board and includes items such as device main body 2, circuit board conveying and holding device 4, component supply device 6, and head moving device 8. Circuit board conveying and holding device 4 conveys circuit board P (also referred to as board P) in a horizontal state and holds board P, with the conveyance direction of board P in FIG. 1 being the x direction, the width direction of board P being the y direction, and the thickness direction of board P being the z direction. The y direction and the z direction are respectively the front-rear direction and up-down direction of the mounting machine. The x direction, y direction, and z direction and perpendicular to each other. Component supply device 6 supplies electronic components (also referred to as components) s to be mounted on board P and includes items such as multiple tape feeders 14. Head moving device 8 holds mounting head 16 and moves mounting head 16 in the x, y, and z directions; mounting head 16 includes suction nozzle 18 that picks up and holds component s.

Reference numeral 20 indicates a camera. Camera 20 captures an image of a component s held by suction nozzle 18, and based on an image captured by camera 20, it is determined whether component s is planned to be mounted on circuit board P. Reference numeral 22 indicates an inspection device. Inspection device 22 performs inspection by measuring electrical characteristics of component s. Electrical characteristics of component s are measured, and it is determined if the measured electrical characteristics match information (electrical characteristics) related to component s included in the job information, that is, it is determined whether the measured electrical characteristics match the electrical characteristics of the component s planned to be used in the next work. Electrical characteristics of component s correspond to items such as L (inductance), C (capacitance), R (resistance), and Z' (impedance), and at least one of these is measured by inspection device 22.

Figure 2:
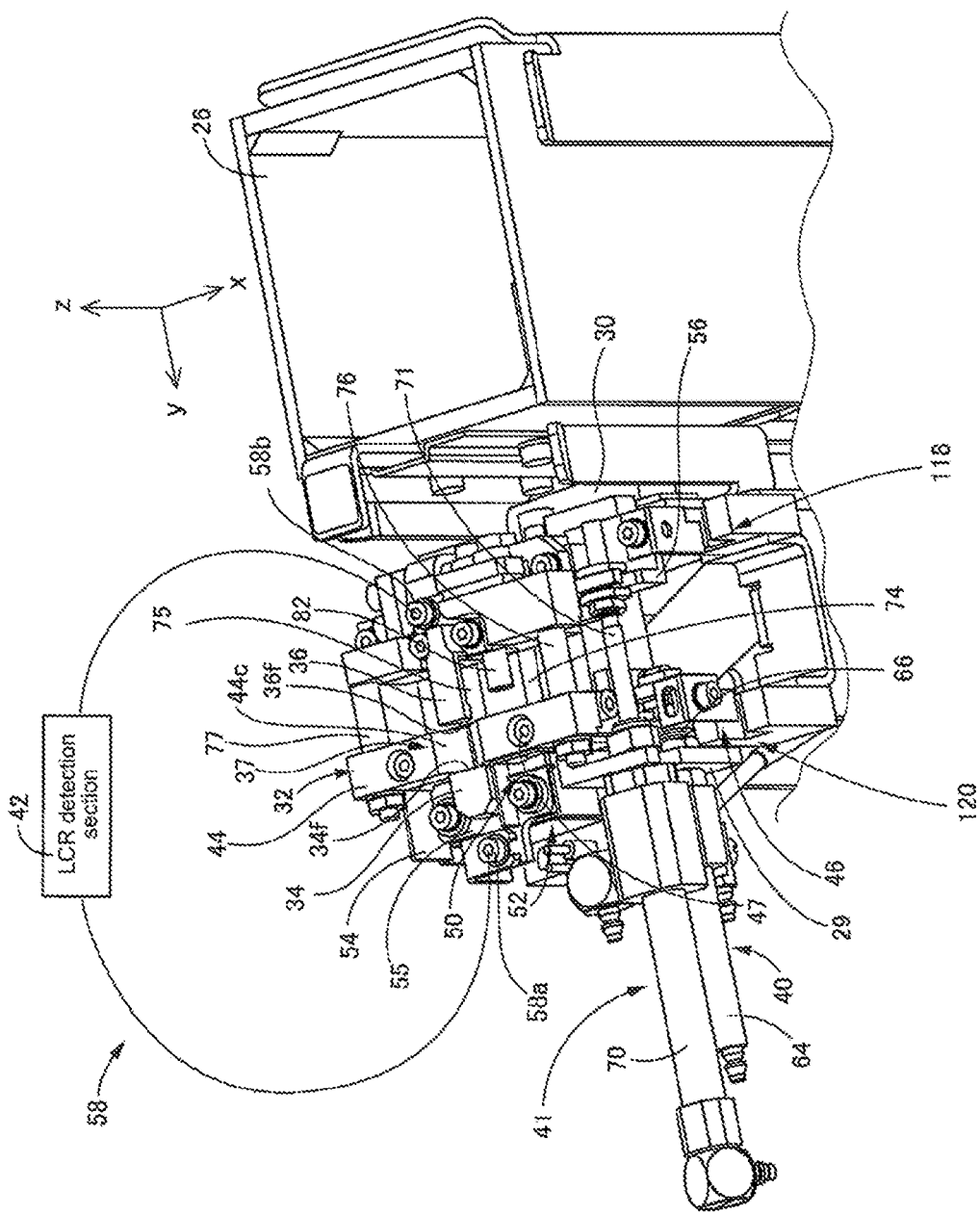
FIG. 2 is a perspective view of main sections of the inspection device.
Figure 10:
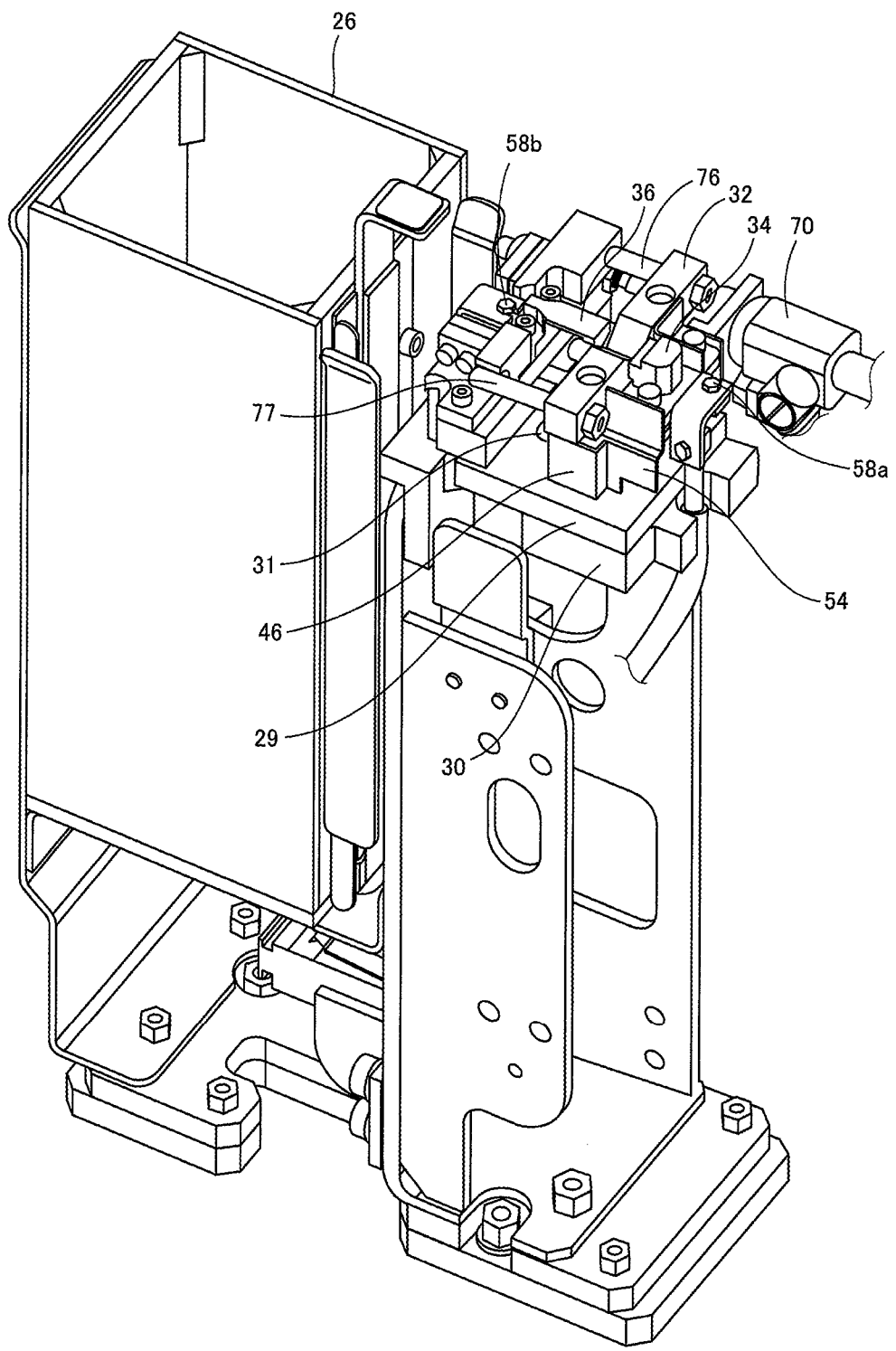
FIG. 10 is a perspective view of the inspection device seen from a different angle than that of FIG. 2.

Inspection device 22 is provided on the main body of circuit board conveying and holding device 4 via waste box 26. Waste box 26 and inspection device 22 are connected by discard passage 28, and components s for which the electrical characteristics have been measured are housed in waste box 26 via discard passage 28. Inspection device 22 is provided on waste box 26 such that the height is adjustable. As shown in FIGS. 2 and 10, base section 30 is engaged with waste box 26 so as to be able to be raised and lowered, and main body 29 is fixed to base section 30 by fastening section 31 (refer to FIGS. 3, 4, and 10) that includes bolts and nuts, such that base section 30 and main body section 29 are held so as to be able to be raised and lowered as one body. Also, openings 29a and 30a connectable to discard passage 28 are each provided on base section 30 and main body 29 (refer to FIGS. 3 and 4). As shown in FIGS. 2 to 4 and FIG. 10, inspection device 22 includes items such as: (i) the above main body 29 and base section 30; (ii) holding table 32 capable of holding component s; (iii) pair of measuring elements formed from fixed element 34 and movable element 36; (iv) holding table moving device 40 that moves holding table 32; (v) movable element moving device 41 that moves movable element 36 towards and away from fixed element 34; and (vi) LCR inspection section 42 as an electrical characteristics inspection section. In the embodiment, component s has electrodes at both ends so as to be able to be gripped by the pair of measuring elements 37. For example, so-called rectangular chips may apply as component s.

Holding table 32 includes component loading section 44, and loading section holding body 46 that holds component loading section 44. V groove 44c is formed in an upper surface of component loading section 44 and component s is loaded in V groove 44c. Because of the V shape, the position of component s is decided accurately. Component loading section 44 is conductive and abrasion-resistant, and is manufactured of a material that does not oxidize easily. Component loading section 44 is electrically connected to base section 30 via multiple members with conductivity, and by base section 30 being grounded, component loading section 44 is also grounded. In the present embodiment, component loading section 44 contacts loading section holding body 46, and is fixed by fastening section 47, and loading section holding body 46 contacts main body 29 via stopper 80 (refer to FIG. 3), and main body 29 is fixed to base section 30 by fastening section 31. Further, loading section holding body 46, stopper 80, main body 29, base section 30, fastening sections 31 and 47, and the like are conductive. Thus, component loading section 44 is grounded. In this manner, by component loading section 44 being manufactured from a conductive material and being grounded, static charge can be eliminated from a component s loaded on component loading section 44. Also, component loading section 44 is manufactured from a material that is abrasion-resistant, so wear on component loading section 44 is curtailed, thus improving durability. Further, because component loading section 44 is manufactured from a material which does not oxidize easily, that is, from a material on which a passivation film that is a metal oxidation film can be formed, component loading section 44 does not rust easily. Because rust does not easily get on component s, lowering of the measurement accuracy of electrical characteristics of component s is curtailed. For example, component loading section 44 may be manufactured from an aluminum alloy or stainless steel.

Figure 3:
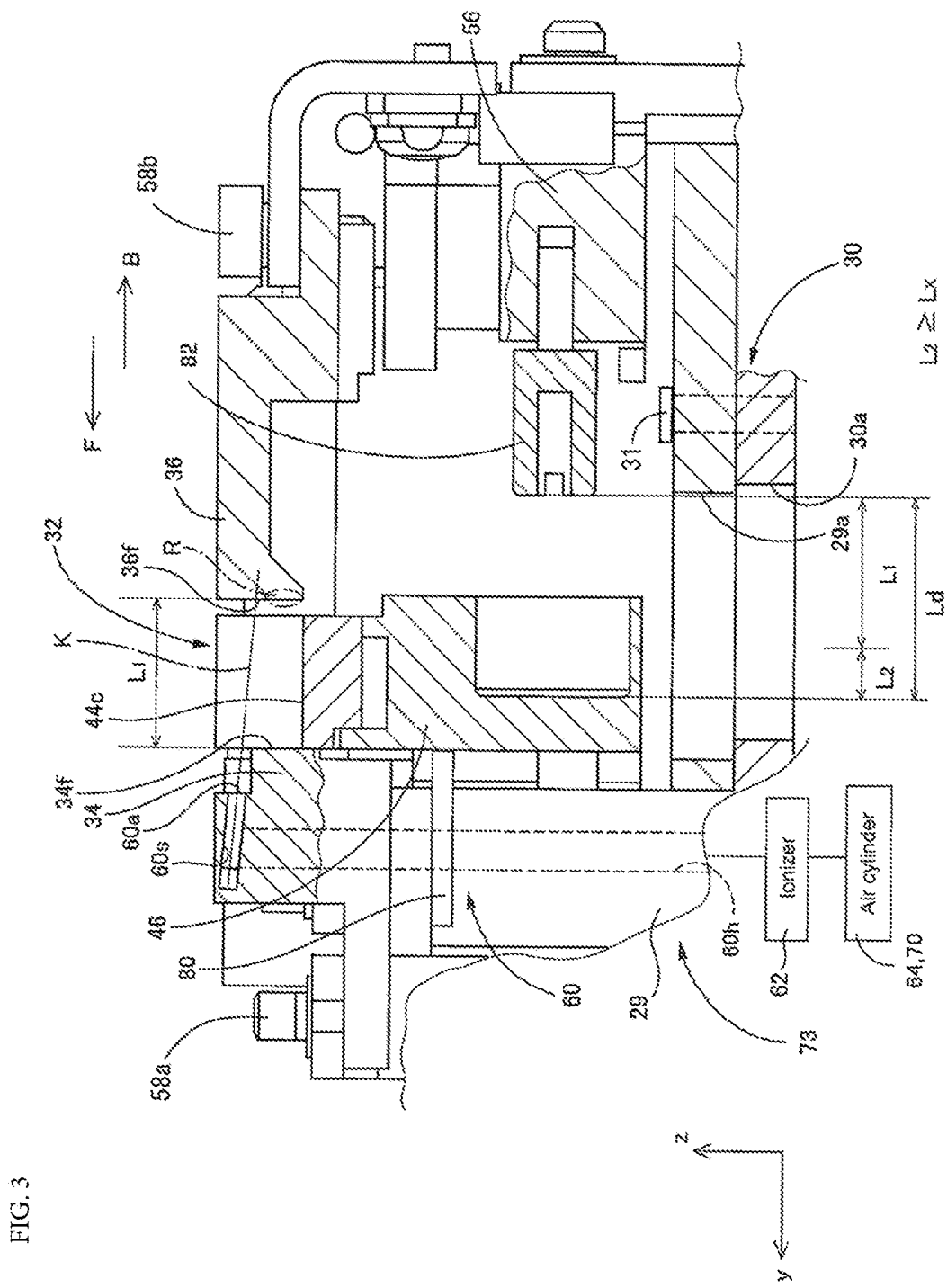
FIG. 3 is a cross section of main sections of the inspection device.
Figure 4:
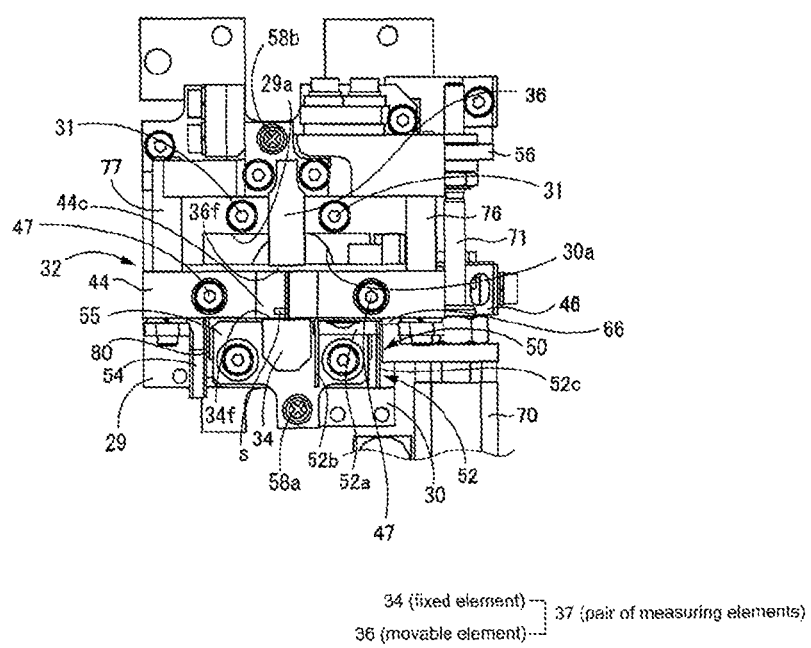
FIG. 4 is a plan view of a portion of the inspection device.

Fixed element 34 and movable element 36 each include opposing surfaces 34f and 36f that oppose each other, and component s is gripped by this pair of opposing surfaces 34f and 36f. Fixed element 34 is fixed to main body 29 via fixed element holding body 55. Moving element 36 is held to be movable together with movable element holding body 56, and is able to move towards and away from fixed element 34. In the present embodiment, opposing surface 36f has a triangular cross section, and is movable along V groove 44c. In other words, the shape of opposing surface 36f of movable element 36 is formed to substantially correspond to V groove 44c, and opposing surface 36f of movable element 36, opposing surface 34f of fixed element 34, and V groove 44c of holding table 32 are positioned at substantially the same height. Therefore, wherever component s is inside V groove 44c, the component s can be gripped by the pair of opposing surfaces 34f and 36f. Also, movable element 36, in the present embodiment, is a long member stretched in the y direction (moving direction), and is held by movable member holding body 56 at the retract end. Further, a section further to the rear than the leading end section including opposing surface 36f is formed in a shape without a portion that protrudes in the x direction from the leading end section. Therefore, when holding table 32 and movable element 36 are moved relatively to each other, holding table 32, in a state in which the bottom section of V groove 44 is positioned above movable member 36, is able to move in a forwards direction and a backwards direction with respect to opposing surface 36f. Further, electric circuit 58 is formed including the pair of measuring elements 37 consisting of movable element 36 and fixed element 34, LCR detection section 42, a power source device that is not shown, and the like. When current is supplied between fixed element 34 and movable element 36, the current flowing is detected, and based on this relationship, electrical characteristics of component s are measured by LCR detection section 42. LCR detection section 42 is not limited to detecting L, C, and R, LCR detection section 42 may detect one or more of a physical quantity that represents items such as L, C, R, and Z'. Note that, reference symbols 58a and 58b of FIGS. 2 to 4 are the connection sections of the pair of measuring elements 37 to electric circuit 58.

Cover section 50 is attached to holding table 32. Cover section 50 includes a pair of cover plates 52 and 54 provided spaced apart from each other in the x direction at both ends of V groove 44c. Cover plate sections 52 and 54 are each provided on the fixed element 34 side of holding table 32, and are formed extending in the y direction and z direction, that is, the moving direction of holding table 32 and movable element 36 and the vertical direction, and as a plate member that is bent. Cover plate section 52 is channel-shaped when seen in plan view, and includes bottom plate section 52a and side plate sections 52b and 52c provided at each side of bottom plate section 52a spaced apart in the x direction. Bottom plate section 52a has a bent lower section so as to form an L-shape when viewed from the side, and an upper section thereof is attached to a side surface on the fixed element 34 side of component loading section 44. Also, at the advanced end position of holding table 32, a lower section of bottom plate section 52 is above fixed element holding body 55, side plate section 52b is positioned to the outside of fixed element 34 and above fixed element holding body 55, and side plate section 52c is positioned to the outside of side plate section 52b and to the outside of fixed element holding body 55. Side plate section 52c has a vertical dimension longer than that of side plate section 52b, and a lower end section thereof extends close to opening 29a of main body 29. Cover plate section 54 is attached to loading section holding body 46 on the opposite side of cover plate section 52 with respect to V groove 44c. Cover plate section 54 is positioned to the outside of fixed element holding body 55 at the advanced end position of holding table 32. Cover plate section 54 is formed bent in the vertical direction, and the lower end section thereof extends close to opening 29a of main body 29. Also, the y direction dimension of cover plate section 54 and side plate section 52c is a size to cover substantially the whole space in the x direction between the pair of opposing surfaces 34f and 36f at least for a period of time in a case in which fixed element 34 and movable element 36 are separated from each other. Note that, cover section 50, as described later, prevents air from diffusing, and functions to prevent scattering of components s that have fallen due to the ejection of air.

In a member on the fixed element side (for example, an upper section of fixed element 34, a portion of fixed element holding body 55 above fixed element 34, or main body 29), opening 60a of air passage 60 facing opposing surface 36f of movable element 36 is formed. Air passage 60, as shown in FIG. 3, includes air ejection passage 60s that extends substantially in the y direction, internal passage 60h formed in main body 29, and the like. Air ejection passage 60s extends slanted downwards the closer it is to movable element 36, and when movable member 36 is at a position separated from fixed element 34, extension line k extends in a state reaching above portion R or inside portion R of opposing surface 36f of movable element 36. Portion R is a portion with a high frequency of gripping component s of opposing surface 36f of movable element 36 and is referred to as a gripping section. Air is applied diagonally from above to a portion at which extension line k of opposing surface 36f intersects. Air cylinders 64 and 70 are connected to air passage 60. Also, ionizer 62 is provided at the downstream side of air cylinders 64 and 70 of air passage 60. Ionizer 62 creates a corona discharge to ionize the air, such that ionized air is supplied to opposing surface 36f.

Figure 5:
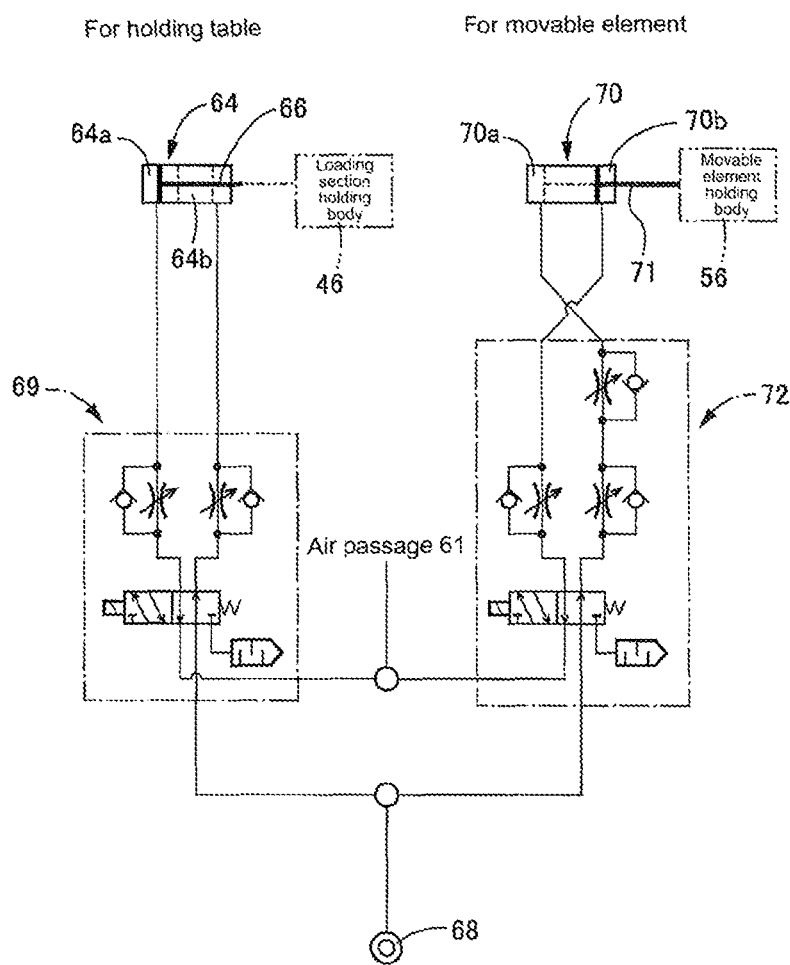
FIG. 5 is a diagram of an air circuit included in the inspection device.

Holding table moving device 40 includes air cylinder 64 as a driving source fixedly provided on main body 29 or base section 30. Piston rod 66 (refer to FIG. 5) of air cylinder 64 is connected to loading section holding body 46. Air cylinder 64 includes two air chambers, 64a and 64b, divided by a piston inside the cylinder housing, and electromagnetic valve device 69 is provided between the two air chambers 64a and 64b, and air source 68, air passage 60, and a filter (atmosphere). Electromagnetic valve device 69 includes at least one electromagnetic valve, for example, as shown in FIG. 5, a direction changing valve, or a variable valve. The moving direction of loading section holding body 46 is controlled by a direction changing valve, and the movement and stopping of loading section holding body 46 is controlled by a variable valve. Holding table 32 is advanced forwards (moved in the direction of arrow F in FIG. 3) by air source 68 being connected to air chamber 64b and air passage 60 being connected to air chamber 64a by electromagnetic valve device 69, and holding table is retracted backwards (moved in the direction of arrow B in FIG. 3) by air chamber 64b being opened to the atmosphere and air source 68 being connected to air chamber 64a by electromagnetic valve device 69.

Movable element moving device 41 includes air cylinder 70 as a driving source fixedly provided on main body 29. Movable element holding body 56 that is able to be moved together with the movable element is connected to piston rod 71 of air cylinder 70. Air source 68, air passage 60, and a filter (atmosphere) are connected to two air chambers, 70a and 70b, that are divided by a piston inside the housing of air cylinder 70 via electromagnetic valve device 72. Electromagnetic valve device 72 includes at least one electromagnetic valve, for example, a direction changing valve, or a variable valve. Movable element 36 is retracted backwards by air chamber 70b being connected to air passage 60 and air chamber 70a being connected to air source 68 by electromagnetic valve device 72, and movable element 36 is advanced forwards by air chamber 70a being opened to the atmosphere and air chamber 70b being connected to air source 68 by electromagnetic valve device 72. In the present embodiment, air supply device 73 is configured from items such as air cylinders 64 and 70, air passage 60 (including air ejection passage 60s), opening 60a, cover section 50, and ionizer 62. Air supply device 73 is also a movable element supply section and driving source interlinking supply section. Also, opposing surface 36f corresponds to a supply target surface. Note that, the construction of electromagnetic valve devices 69 and 72 is not limited to the present embodiment. For example, one three-position valve may be used, or multiple open-close valves may be used. Also, ionizer 62 is not essential.

A pair of guide rods 74 and 75 that extend in the y direction are provided between movable element holding body 56 and main body 29, and a pair of guide rods 76 and 77 that extend in the y direction are provided between holding table 32 and movable element holding body 56. An end section of guide rods 74 and 75 is connected to movable element holding body 56, and the other end is slidably engaged with main body 29. Guide rods 76 and 77 are connected to loading section holding body 46 at one end, and are slidably engaged with movable element holding body 56. By these guide rods 74, 75, 76, and 77, holding table 32 and movable element 36 are relatively movable in the y direction with respect to main body 29, and moving table 32 and movable element 36 are relatively movable in the y direction with respect to each other. Also, as shown in FIG. 3, stopper 82 is provided on the fixed element side of movable element holding body 56, and stopper 80 is provided on a portion of main body 29 that holds fixed element holding body 55. Stopper 82 regulates how close together movable element holding body 56 and holding table 32 (loading section holding body 46) are; stopper 80 regulates how close together fixed element 34 (main body 29) and holding table 32 (loading section holding body 46) are. In the present embodiment, guide rods 74 to 77 are shared between holding table moving device 40 and movable element moving device 41, and stoppers 80 and 82 can be thought of as configuration elements of holding table moving device 40. Note that, as shown in FIG. 3, gap Ld between the front end section of stopper 82 when movable element 36 is at the retract end position, and loading section holding body 46 when holding table 32 is at the advanced end position is the distance in which relative movement between movable element 36 and holding body 32 is allowed.

Figure 6:
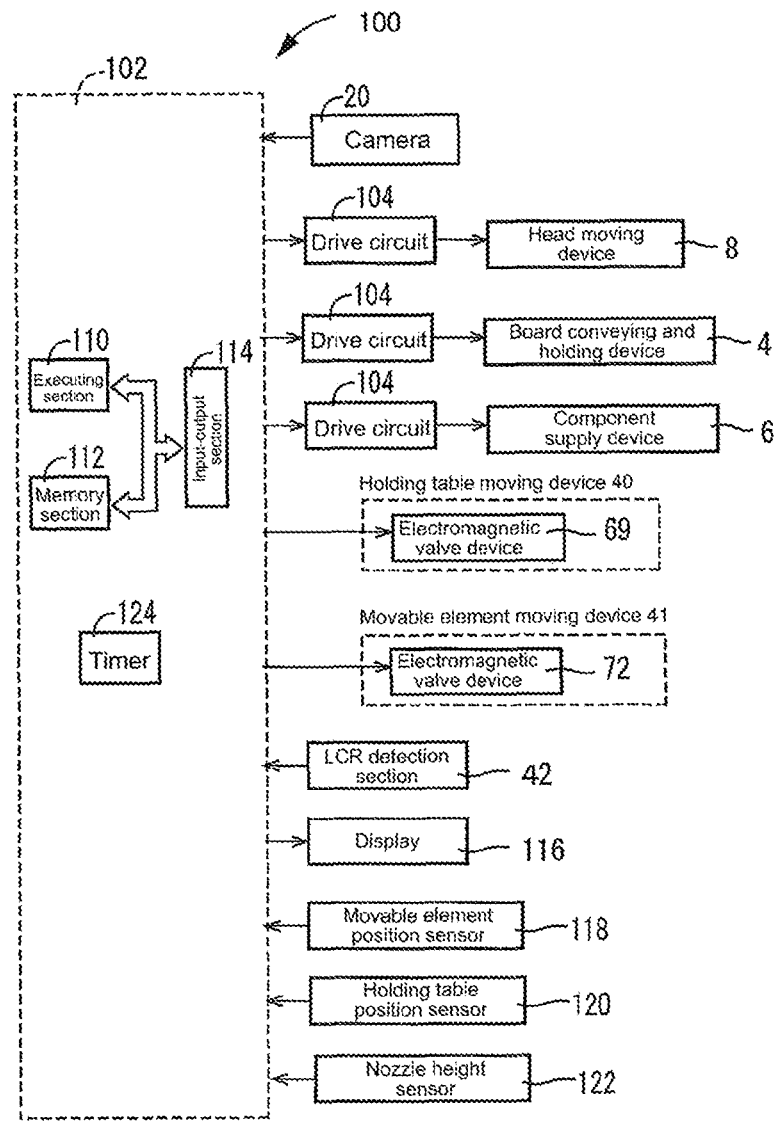
FIG. 6 schematically shows a control device of the mounting machine.

The mounter includes control device 100. As shown in FIG. 6, control device 100 includes controller 102 configured mainly of a computer, and multiple drive circuits 104. Controller 102 includes items such as executing section 110, memory section 112, and input-output section 114, with each of board conveying and holding device 4, component supply device 6, and head moving device 8 being connected to input-output section 114 via a drive circuit 104, and items such as electromagnetic valve devices 69 and 72 of holding table moving device 40, and movable element moving device 41 also being connected to input-output section 114. Also connected are items such as LCR detection section 42, display 116, movable element position sensor 118, holding table position sensor 120, and nozzle height sensor 122 for detecting the height of nozzle 18. Memory section 112 stores multiple programs and tables such as the LCR detection program shown in the flowchart of FIG. 7(a). Also, time measurement is performed by timer 124 provided on controller 102. Note that, in the present embodiment, descriptions are given in a case in which overall control of the mounter is performed by control device 100, but control of items such as board conveying and holding device 4, component supply device 6, and head moving device 8 may be performed by individual control devices.

Operation of the mounter is described below. When changeover and so on is performed, in cases such as when a new tape feeder 14 is set, or when a tape feeder 14 is exchanged, electrical characteristics of the component s held by that tape feeder 14 are measured, and it is inspected whether that tape feeder 14 (or that component s) is appropriate. Also, the inspection result is displayed on display 116. If the result indicates the tape feeder 14 or component s is not appropriate, the tape feeder 14 is replaced.

Figure 7:
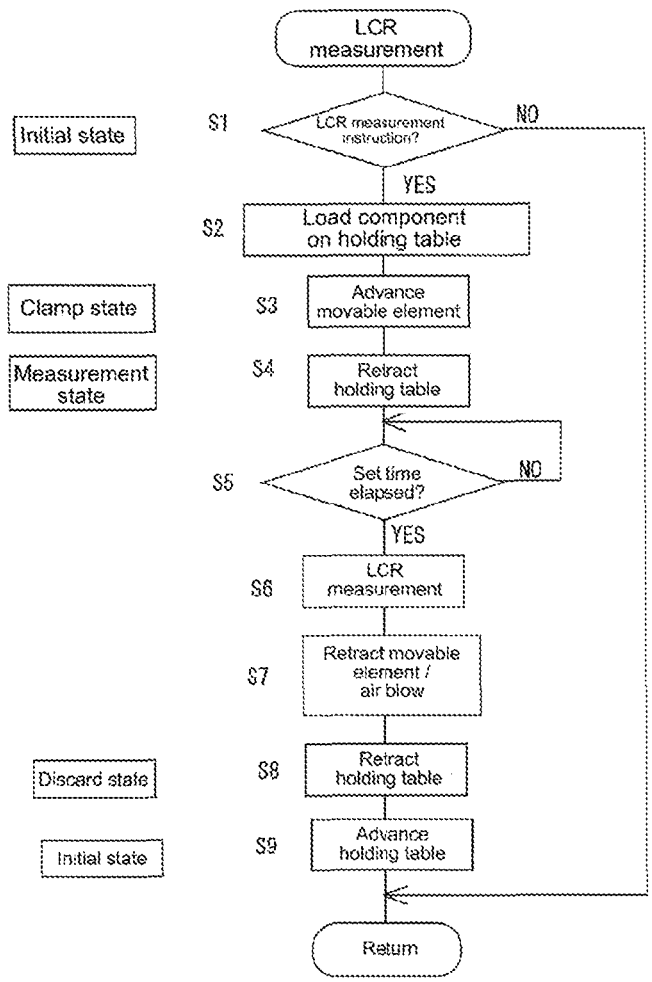
FIG. 7(a) is a flowchart showing an LCR measurement program memorized on a memory section of the control device.
FIG. 7(b) is a time chart when performing LCR measurement at the inspection device.
Figure 7:
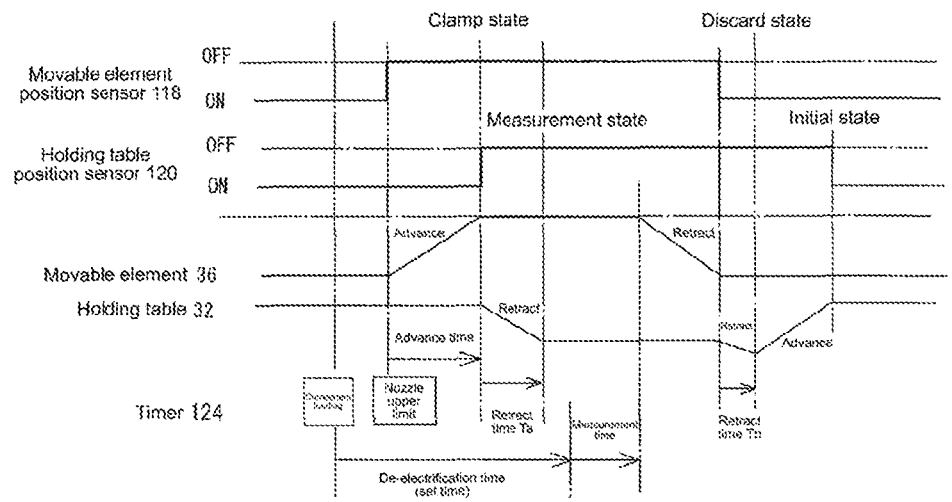
Figure 8:
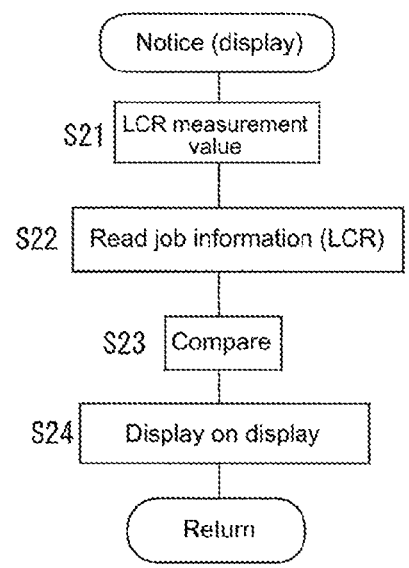
FIG. 8 is a flowchart showing a component suitability determination program memorized on the memory section of the control device.

Electrical characteristics of component s are measured by performing the LCR measurement program shown in the flowchart of FIG. 7(a). Also, movement of holding table 32 and movable member 36 and states of holding table position sensor 120 and movable element position sensor 118 are shown in FIG. 7(b). Inspection device 22 is normally in the initial state shown in FIG. 9(a). Movable element 36 is at the retract end position and movable table 32 is at the advanced end position, that is, at a position contacting stopper 80. In this state, holding table 32 is in an earthed state due to internal conduction and so on. Movable element 36 is not above V groove 44c of holding table 32, so component s can be loaded. Also, cover section 50 is positioned on both sides of fixed element 34 (separated in the x direction). Movable element position sensor 118 and holding table position sensor 120 are both on. In step 1 (hereinafter also referred to as S1, with similar notation used for other steps), it is determined whether an instruction for measuring electrical characteristics of component s has been output. In a case in which changeover is performed or the like, an instruction for measuring electrical characteristics is output. When the measurement instruction is output, in S2, mounting head 16 is moved, for example, and suction nozzle 18 picks up a component s held by a newly attached tape feeder 14, and loads the component s on V groove 44c of holding table 32. Suction nozzle 18 is lowered and component s is released such that component s is loaded on V groove 44c.

Then, the fact that suction nozzle 18 has loaded component s on V groove 44c and reached the upper limit is detected by nozzle height sensor 122, and in S3, movable element 36 is advanced by controlling electromagnetic valve 72, and movable element position sensor 118 turns from on to off. Opposing surface 36f of the edge of movable member 36 is advanced forwards along V groove 44c of component loading section 44, and component s is clamped by opposing surface 36f and opposing surface 34f of fixed element 34 (refer to FIG. 9[b]). In the present embodiment, stroke $L_1$ (refer to FIG. 3) of movable element 36 from the retract end position to the clamping of component s is decided by the size and so on of the component s to be clamped, and is thus decided in advance. After advancing of movable element 36 is started, when the time required for movable element 36 to advance stroke L1 has elapsed, advancing of movable member 36 is stopped by performing variable control. The advancing time is measured by timer 124. Holding table 32 is at the advanced end position and movable element 36 is advanced, such that component s is held in a clamped state by the pair of opposing surfaces 34f and 36f.

In S4, holding table 32 is retracted by control of electromagnetic valve device 69, and holding table position sensor 120 is switched from on to off. Holding table 32 is retracted until contacting with stopper 82 (refer to FIG. 9[c]), and is held at that position. The stroke of holding table 32 between those positions is $L_2$ (refer to FIG. 3).

$$L_2 = Ld - L_1$$

In the present embodiment, stroke $L_2$ is equal to or greater than set value $L_x$ ($L_2 \geq L_x$), and component loading section 44 is separated from component s by at least $L_x$. When a conductive material (component loading section 44) is positioned near component s when electrical properties are being measured, static induction occurs, leading to occurrences of an eddy current or the like, meaning that the electrical properties cannot be detected correctly. With respect to this, if component loading section 44 is separated from component s by set value $L_x$ or greater (that is, if the minimum distance between component loading section 44 and component s is set value $L_x$ or greater), measurement errors of the electrical characteristics that occur due to component loading section 44 being close to component s can be reduced. In this manner, set value $L_x$ is a distance for which component loading section 44 has little effect on the measurement of electrical characteristics of component s, and is a value acquired by performing experiments in advance or the like. This state is a measuring state. Note that, when retracting time Ta which is a time required from the starting of retracting of holding table 32 to holding table 32 retracting stroke L2 has elapsed, holding table 32 is held in position by controlling electromagnetic valve device 69. Retracting time Ta is measured by timer 124.

In S5, component s is released by suction nozzle 18, and the system waits from the time that the component s was loaded on V groove 44 c for a set static elimination time. Each of the components s held by tape feeder 14 is in an electrified state due to static that occurs because of vibration and contact with items that happens during transport by tape feeder 14. Electrified component s has static removed by being loaded on component loading section 44 that is earthed and made of a conductive material, and due to static discharge into the air. Static elimination time is the time required to remove the amount of static electricity that component s is estimated to have, and is decided by experiments performed in advance or the like, or is logically decided based on the size and specific characteristics of component s. When the time elapsed since component s was loaded on component loading section 44 has reached the de-electrification time, the determination in S5 is yes, and the electrical characteristics of component s are measured in S6. Then, when the measuring time required for measuring the electrical characteristics has elapsed, S7 is performed, wherein the measuring time may be decided based on the type of component or the like, or may be a fixed time. In either case, this time is acquired in advance and memorized.

Figure 9:
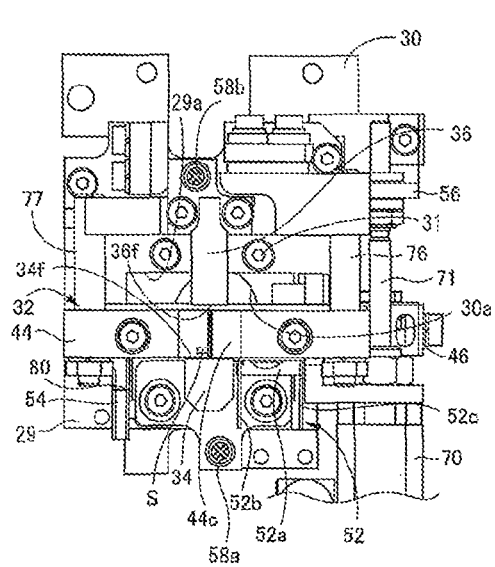
FIG. 9 shows operation of the inspection device.
Figure 9:
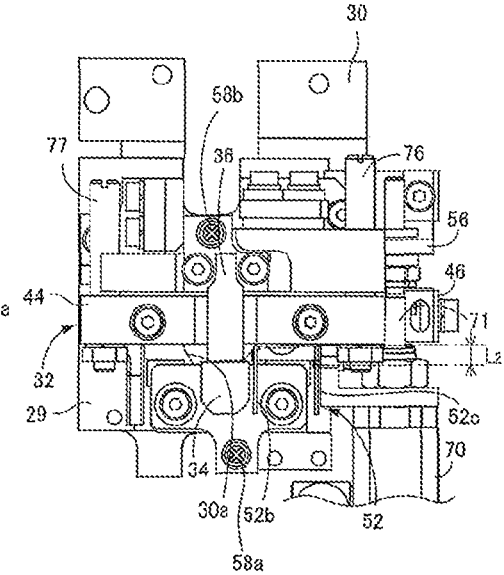
Figure 9:
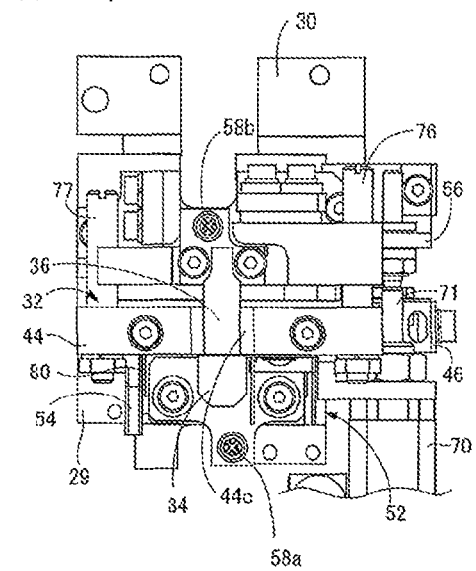
Figure 9:
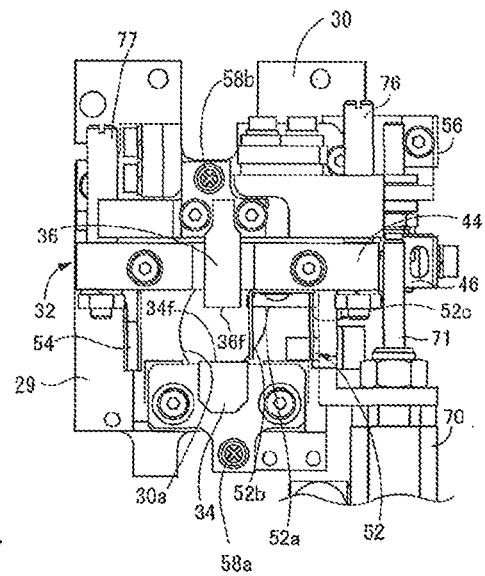

When the measuring time elapses and measurement of the electrical characteristics of component s is complete, in S7, movable element 36 is retracted by control of electromagnetic valve device 72. When the retract end is reached, movable element position sensor 118 turns on. In S8, holding table 32 is retracted by control of electromagnetic valve device 69 (refer to FIG. 9[d]). The stroke of holding table 32 in the measuring state to the retract end position at which movable element 36 contacts stopper 82 is $L_1$. Therefore, after retract time Tb, which is the time required for holding table 32 to retract by stroke $L_1$, has elapsed, contact with stopper 82 is known. As shown in FIG. 9(d), holding table 32 is positioned further to the rear than opposing surface 36f of movable element 36, and is not below an area between the pair of opposing surfaces 34f and 36f. This is the discard state. When holding table 32 is retracted until contacting stopper 82, in S9, by controlling electromagnetic valve device 69, at air cylinder 64, air chamber 64b is connected to air source 68, and air chamber 64a is connected to air passage 60. Holding table 32 is advanced and when contacting stopper 80, holding table position sensor 120 turns on. Holding table 32 is positioned between the pair of opposing surfaces 34f and 36f (V groove 44 is positioned below opposing surfaces 34f and 36f), and there is an empty space above V groove 44c. Therefore, a component s can be loaded. This is the initial state.

Opposing surface 36f of movable element 36 moves away from opposing surface 34f of fixed element 34, and thus the component s held between them is released. Also, when movable element 36 is retracted, air chamber 70a of air cylinder 70 is connected to air passage 60, and cover plate sections 52 and 54 are positioned at both ends in the x direction of the space between the pair of opposing surfaces 34f and 36f. Further, by holding table 32 being moved behind opposing surface 36f of movable element 36, it is no longer under the area between the pair of opposing surfaces 34f and 36f, and between the pair of opposing surfaces 34f and 36f is connected to openings 29a and 39a and discard passage 28. In accordance with the retracting of movable element 36, air flowing from air chamber 70a is supplied from opening 60a from diagonally above opposing surface 36f of movable member 36, and the space in which air is supplied, that is, the space between the pair of opposing surfaces 34f and 36f is covered from the x direction by cover sections 50. Air, after mainly contacting opposing surface 36f, flows down along opposing surface 36f. Therefore, even if component s were to adhere to portion R without falling from opposing surface 36f, component s can be made to fall favorably. Also, because air flows in a whirling manner inside cover section 50, component s can be made to fall even if adhering to opposing surface 34f of fixed element 34. Further, for a component s that falls from opposing surfaces 34f and 36f to be loaded on holding table 32, using air to cause the component s to fall may be considered, but, even in a case in which a component s on V groove 44 was not caused to drop by air, the component s would be reliably caused to drop by the advancing of opposing surface 36f of movable element 36 in accordance with the retracting of holding table 32. In this manner, in the present embodiment, the discard state can be thought of as a state in which component s drops favorably. Note that, component s that drops from the pair of opposing surfaces 34f and 36f is favorably collected in waste box 26 after passing through openings 29a and 30a and discard passage 28.

Also, providing cover section 50 prevents dropped components s from scattering. Because side plate section 52c of cover plate section 52 and the lower end section of cover plate 54 extend until near opening 29a of main body 29, component s can be favorably collected in waste box 26 after passing from opening 29a to waste passage 28. On the other hand, when ionized air is supplied, it is possible to electrically neutralize opposing surfaces 36f and 34f of movable element 36 and fixed element 34, such that the measurement accuracy of the electrical characteristics of the next component s can be improved. Further, at air cylinder 64, when holding table 32 is advanced (S9), air chamber 64a is connected to air ejection passage 60s. Also, when transitioning from the discard state to the initial state, because air can be supplied to opposing surface 36f of movable element 36, it is possible to favorably perform elimination of static on opposing surface 36f of movable element 36.

On the other hand, the measured electrical characteristics and electrical characteristics included in the job information are compared, it is determined whether the component s is the correct component to be used in the subsequent work (job) to be performed, and the determination result is displayed on display 116. In S21, measurement values of the electrical characteristics of the component s are acquired, and in S22, information corresponding to the next job is read from the job information. In S23, these are compared and it is determined whether they match. Whether they match or not, the determination result is displayed on display 116. In the event that they do not match, work of exchanging appropriate tape feeders or the like is performed.

As given above, in the present embodiment, component loading section 44 is made of conductive material and is grounded. Therefore, before measurement of electrical characteristics, elimination of static on component s loaded on component loading section 44 can be performed favorably. On the other hand, if component s is electrified, it is difficult to measure the impedance of component s. In contrast, with the present embodiment, because component s is favorably de-electrified, the impedance of component s can be measured favorably. Further, because component s is caused to drop into discard passage 28 in parallel with the retracting of movable element 36, compared to performing retraction of the movable element and discarding of the component s in separate processes, it is possible to measure the electrical characteristics in a shorter time.

In the above manner, with the present embodiment, the movement control device and relative movement control device are configured from items such as: a portion of controller 102 that memorizes S4, S7, and S8 of the LCR measurement program; a portion for executing S4, S7, and S8; timer 124; movable element position sensor 118, and holding table position sensor 120. Also, the measurement control section is configured from items such as a portion that memorizes S4, and a portion that executes S4; the discard control section is configured from items such as a portion that memorizes S8, and a portion that executes S8; and preparation control section is configured from a portion that memorizes S9, and a portion that executes S9. The movement control device is also the holding table moving control device and the relative movement control device. Also, air cylinder 70 corresponds to the movable element cylinder, and air cylinder 64 corresponds to the holding table cylinder. Air supply device 73 is also a movable element supply section and driving source interlinking supply section. Further, the electrical characteristic acquisition device is configured from items such as the pair of measuring elements 37, electrical circuit 58 including LCR detection section 42, the portion of controller that memorizes S6, and the portion that executes S6. Further, S3 corresponds to a clamping process, S4 and S6 correspond to a measurement process, S7 and S8 correspond to a discard process, and S9 corresponds to a preparation process.

Note that, it is possible to move both of the measurement elements, and to fix the holding table to the main body. In this case too, the pair of measuring elements can grip component s loaded on the holding table, and by moving the pair of measuring elements, component s can be separated from the holding table by at least a set value. Also, the holding table may be movable in a vertical direction. In this case too, with component s in a state clamped by the pair of measuring elements, the holding table can be separated from component s by at least a set value. Further, the air ejection passage may be provided on a side of main body 29 of inspection device 22 in a state with an opening that opens approximately in the x direction. In other words, one of cover plate sections 52 and 54 may be omitted (for example, cover plate section 54), and the air ejection passage with an opening in the x direction may be provided on that side. As a result, air is supplied towards cover plate section 52 along opposing surfaces 34f and 36f (surfaces extending in the x and z directions), thus component s adhering to the pair of opposing surfaces 34f and 36f can be caused to drop. Also, after measuring the electrical characteristics of component s, holding table 32 may be retracted in accordance with the retracting of movable element 36 (for example, by performing retraction at the same time). This state of holding table 32 and movable element 36 may be the discard state. Further, movable element position sensor 118 and holding table position sensor 120 are not essential. For example, electromagnetic valve devices 69 and 72 may be controlled by measurement by timer 124. Also, in addition to the disclosed embodiments, the present disclosure may be modified and improved based on knowledge of someone skilled in the art, such as the air supply device is also not essential.

REFERENCE SIGNS LIST

22: inspection device; 26: waste box; 28: discard passage; 29: main body; 29a: opening; 30: base section; 30a: opening; 31: fastening section; 32: holding table; 34: fixed element; 36: movable element; 34f, 36f: opposing surface; 40: holding table moving device; 41: movable element moving device; 42: LCR detection section; 44: component loading section: 44c: V groove; 50: cover section; 72: air supply device; 100: control device; 118: movable element position sensor; 118: holding table position sensor; 124: timer Claimable Subject Matter (1) An inspection device provided in a mounter that picks up components supplied by a component supply device and mounts the components on the circuit board, the inspection device including:

a holding table capable of holding a component; a pair of measuring elements capable of moving towards and away from each other and capable of measuring electrical characteristics of a component by gripping the component;

a holding table moving device that moves the holding table;

a holding table movement control device that controls the holding table moving device, wherein the holding table movement control device includes a measurement control section that, from a clamping state in which the pair of measuring elements grips the component held on the holding table, separates the holding table from the component by at least a set value, thus changing to a measurement state in which it is possible to measure electrical characteristics of the component.

The holding table may move in a direction parallel to the approaching-separating direction of the pair of measuring elements, or in a direction perpendicular to the approaching-separating direction.

The set value, for example, in a case in which the holding table is conductive, may be set such that the holding table is unlikely to affect the measuring of the electrical characteristics of the component.

(2) The inspection device of (1), wherein the holding table is conductive.

(3) The inspection device of (1) or (2), wherein the pair of measuring elements include a pair of opposing surfaces that oppose each other and that can contact the component, the component is held by the pair of opposing surfaces moving closer to each other, the component is released by the pair of opposing surfaces moving away from each other, and the holding table moving device includes a discard control section that changes from the measurement state to a discard state in which the holding table is not below the space between the pair of opposing surfaces that have been separated from each other, by moving the holding table.

(4) The inspection device of (3), wherein the holding table moving control device includes a preparation control section that changes from the discard state to an initial state in which the holding table can hold the component by moving the holding table below the space between the pair of opposing surfaces that have been separated from each other.

(5) The inspection device of any of (1) to (4), wherein the mounter includes a discard passage connected to the inspection device, and the main body of the inspection device includes an opening that can be connected to the discard passage.

At least the position or size of the opening may be decided so as to be in an open state below the space between the pair of opposing surfaces in the discard state.

(6) The inspection device of any of (1) to (5), wherein the inspection device includes an electrical characteristic acquisition section that supplies current between the pair of measuring elements, detects the current flowing between the pair of measuring elements and acquires the electrical characteristics of the component, and the electrical characteristic acquisition section includes a delay type measuring section that starts measuring the electrical characteristics of the component when at least a set time has elapsed since the component was loaded on holding table.

The set time, for example, may be elimination time required to eliminate static from the component. Static elimination time may be decided based on the component, or may be determined in advance regardless of the component. Note that, time of loading the component on the holding table may be considered elimination time.

(7) The inspection device of any of (1) to (6), wherein the pair of measuring elements includes a fixed element that is fixed to a main body and a movable element that is relatively movable with respect to the fixed element, and the inspection device includes a movable element moving device that moves the movable element with respect to the fixed element, and a movable element control device that controls the movable element moving device so as to move the pair of measuring elements towards and away from each other.

(8) The inspection device of (7), wherein the inspection device includes a connecting mechanism that connects the movable element and the holding table in a relatively movable manner.

For example, the movable element may be formed in a rectangular shape extending in a direction parallel to the movement direction of the movable element. Also, the holding table, when positioned in front of the leading end of the movable element, or may be positioned to the rear.

(9) The inspection device of any one of (1) to (8), wherein the holding table includes a V groove formed with a V-shaped cross section, and the cross section of the leading end section of at least one of the measuring elements may have a triangular shape corresponding the V groove.

(10) An inspection device provided in a mounter that picks up components supplied by a component supply device and mounts the components on the circuit board, the inspection device including:

a holding table capable of holding a component;

a pair of measuring elements capable moving towards and away from each other and capable of measuring electrical characteristics of a component by gripping the component;

a relative movement device that relatively moves the pair of measuring elements and the holding table; and a relative movement control device that controls the relative movement device, wherein the relative movement device includes a measurement control section that, from a clamping state in which the pair of measuring elements grips the component held on the holding table, separates the holding table from the component by at least a set value, thus changing to a measurement state in which it is possible to measure electrical characteristics of the component.

With such an inspection device, technology disclosed in any one of (1) to (9) may be applied.

The relative moving device may be (a) a device that fixes the holding table and moves the pair of measuring elements, or (b) a device that fixes one of the pair of the measuring elements and moves the other measuring element and the holding table. In the case of (a), for example, this corresponds to a case in which, in a state with a component held by the holding table clamped by the pair of measuring elements, the pair of measuring elements are moved relative to the holding table, and the component and the holding table are separated by at least a set value.

(11) An inspection method for performing inspection related to electrical characteristics at an inspection device that is provided on a mounter that picks up components supplied by a component supply device and mounts the components on a circuit board, the inspection device including (i) a holding table capable of holding the component, and (ii) a pair of measuring elements capable moving towards and away from each other and capable of measuring electrical characteristics of a component by gripping the component, the inspection method comprising:

a clamping process by which the pair of measuring elements performs gripping; and a measurement process in which the holding table is separated from the component gripped by the pair of measuring elements by at least a set amount, and the electrical characteristics of the component are measured.

This inspection method may be performed at an inspection device from any one of (1) to (10).

(12) The inspection method of (11) further including:

a discard process in which, after performing the measurement process, the pair of measuring elements are separated from each other, and the holding table is retracted from a region below between the opposing surfaces of the pair of measuring elements that oppose each other; and a preparation process in which the holding table is inserted below an area between the opposing surfaces of the pair of measuring elements, and an initial state is created in which holding the component is possible. In the discard process, separating of the pair of measuring elements and retracting of the holding table may be performed in order, or may be performed in parallel.

(13) An inspection device included in a mounter that picks up components supplied by a component supply device and mounts the components on the circuit board, the inspection device comprising:

a holding table that is conductive and configured to hold a component; and an electrical characteristic acquisition device configured to acquire electrical characteristics of the component in a state with the component held on the holding table gripped and the component separated from the holding table.

With such an inspection device, technology disclosed in any one of (1) to (12) may be applied.

(14) The inspection device of any one of (1) to (13) wherein, the pair of measuring elements measure electrical characteristics of the component by sandwiching the component between a pair of opposing surfaces by being brought closer to each other, and release the component from the pair of opposing surfaces by being separated from each other, and the inspection includes an air supply device that in a case in which the pair of measuring elements are separated, supplies air to an air supply target surface that is at least one of the pair of opposing surfaces.

A case in which the pair of measuring elements are separated corresponds to a period while separation is occurring, a portion or the entire process of separation, during the start of separation, when separation is completed, or the like.

(15) The inspection device of (14) wherein the air supply device includes an ionizer configured to ionize the air, and the ionized sir is supplied to the supply target surface.

(16) The inspection device of (14) or (15) wherein the air supply device includes an air passage that has an opening facing the supply target surface.

When the supply target surface is one of the pair of opposing surfaces, one opening is provided facing that supply target surface; when the supply target surface is both of the pair of opposing surfaces, two openings are provided facing each of the supply target surfaces.

(17) The inspection device of (16) wherein the air passage includes an air ejection passage inclined downwards as it approaches the target supply surface.

(18) The inspection device of (17) wherein the inclined angle of the air ejection passage is an angle such that the air hits above a portion of the supply target surface that grips the component.

(19) The inspection device of any one of (14) to (18), wherein the pair of measuring elements includes a fixed element fixed to a main body and a movable element configured to move towards and away from the fixed element, and the air supply device includes a movable element supply section that supplies the air to the opposing surface of the movable element that is the supply target surface in a case of the movable element being moved away from the fixed element.

(20) The inspection device of (19), further including
a movable element moving device provided with a movable element cylinder that moves the movable element towards and away from the fixed element via operation of the movable element cylinder, wherein the air supply device includes a drive source interacting supply section configured to supply air ejected from the movable element cylinder in accordance with the movable element moving away from the fixed element to an opposing surface of the movable element.

(21) The inspection device of any one of (1) to (20) including a cover section that is configured to cover a space between the pair of opposing surfaces that are in a separated state.

The cover section is for covering a large portion of an area between the pair of opposing surfaces, there is no need to cover the entire area between the pair of opposing surfaces, and coverage with a gap to a certain extent is acceptable. However, it is desirable that for at least a point in time when the pair of opposing surfaces are separated for the entire area between the pair of opposing surfaces to be covered from both sides.

(22) The inspection device of (21) wherein the cover section is attached to the holding table, and covers a large portion of the area between the pair of opposing surfaces in a state with the holding table at the retract end position.

The invention claimed is:

1. An inspection device provided on a mounting machine that picks up a component supplied from a component supply device and mounts the component on a board, the inspection device comprising:
- a pair of measuring elements configured to measure electrical characteristics of the component by sandwiching the component between a pair of opposing surfaces by being brought closer to each other in a first direction, and to release the component from the pair of opposing surfaces by being separated from each other; and
- an air supply device configured to, in a case in which the pair of measuring elements are separated, supply air to at least one of the pair of opposing surfaces, wherein
- the air supply device includes an air passage with an opening facing the one of the pair of opposing surfaces, and
- the air passage includes a jetting passage that extends in a second direction that is inclined with respect to the first direction as it approaches the one of the pair of opposing surfaces.

2. The inspection device according to claim 1, wherein
- the air supply device includes an ionizer configured to ionize the air, and
- the ionized air is supplied to the one of the pair of opposing surfaces.

3. The inspection device according to claim 1, wherein
- the pair of measuring elements includes a fixed measuring element fixed to a main body and a movable measuring element configured to move towards and away from the fixed measuring element, and
- the air supply device includes a movable element supply section that supplies the air to a surface of the movable measuring element that is the one of the pair of opposing surfaces in a case of the movable measuring element being moved away from the fixed measuring element.

4. The inspection device according to claim 3, further comprising:
- a movable element moving device provided with a movable element cylinder that moves the movable measuring element towards and away from the fixed measuring element via operation of the movable element cylinder,
- wherein the air supply device includes a drive source interacting supply section configured to supply air ejected from the movable element cylinder in accordance with the movable measuring element moving away from the fixed measuring element to the surface of the movable measuring element.

5. The inspection device according to claim 1, further comprising:
- a cover that is configured to cover a space between the pair of opposing surfaces when they are in a separated state.

6. An inspection device provided on a mounting machine that picks up a component supplied from a component supply device and mounts the component on a board, the inspection device comprising:
- a pair of measuring elements configured to measure electrical characteristics of the component by sandwiching the component between a pair of opposing surfaces by being brought closer to each other, and to release the component from the pair of opposing surfaces by being separated from each other; and
- an air supply device configured to, in a case in which the pair of measuring elements are separated, supply air to at least one of the pair of opposing surfaces, wherein
- the pair of measuring elements includes a fixed measuring element fixed to a main body and a movable measuring element configured to move towards and away from the fixed measuring element, and
- the air supply device includes a movable element supply section that supplies the air to a surface of the movable measuring element that is the one of the pair of opposing surfaces in a case of the movable measuring element being moved away from the fixed measuring element.

7. The inspection device according to claim 6, wherein
- the air supply device includes an ionizer configured to ionize the air, and
- the ionized air is supplied to the one of the pair of opposing surfaces.

8. The inspection device according to claim 6, wherein the air supply device includes an air passage with an opening facing the one of the pair of opposing surfaces.

9. The inspection device according to claim 8, wherein
- the pair of opposing surfaces are brought closer to each other in a first direction, and
- the air passage includes a jetting passage that extends in a second direction that is inclined with respect to the first direction as it approaches the one of the pair of opposing surfaces.

10. The inspection device according to claim 6, further comprising:
- a movable element moving device provided with a movable element cylinder that moves the movable measuring element towards and away from the fixed measuring element via operation of the movable element cylinder,
- wherein the air supply device includes a drive source interacting supply section configured to supply air ejected from the movable element cylinder in accordance with the movable measuring element moving away from the fixed measuring element to the surface of the movable measuring element.

11. The inspection device according to claim 6, further comprising:
- a cover that is configured to cover a space between the pair of opposing surfaces when they are in a separated state.

12. An inspection device provided on a mounting machine that picks up a component supplied from a component supply device and mounts the component on a board, the inspection device comprising:
- a pair of measuring elements configured to measure electrical characteristics of the component by sandwiching the component between a pair of opposing surfaces by being brought closer to each other, and to release the component from the pair of opposing surfaces by being separated from each other; and
- an air supply device configured to, in a case in which the pair of measuring elements are separated, supply air to at least one of the pair of opposing surfaces, wherein
- the pair of measuring elements includes a fixed measuring element fixed to a main body and a movable measuring element configured to move towards and away from the fixed measuring element,
- the inspection device includes a movable element moving device provided with a movable element cylinder that moves the movable measuring element towards and away from the fixed measuring element via operation of the movable element cylinder, and
- the air supply device includes a drive source interacting supply section configured to supply air ejected from the movable element cylinder in accordance with the movable measuring element moving away from the fixed measuring element to a surface of the movable measuring element that is the one of the pair of opposing surfaces.

13. The inspection device according to claim 12, wherein the air supply device includes an ionizer configured to ionize the air, and the ionized air is supplied to the one of the pair of opposing surfaces.

14. The inspection device according to claim 12, wherein the air supply device includes an air passage with an opening facing the one of the pair of opposing surfaces.

15. The inspection device according to claim 14, wherein the pair of opposing surfaces are brought closer to each other in a first direction, and the air passage includes a jetting passage that extends in a second direction that is inclined with respect to the first direction as it approaches the one of the pair of opposing surfaces.

16. The inspection device according to claim 12, wherein the air supply device includes a movable element supply section that supplies the air to the surface of the movable measuring element in a case of the movable measuring element being moved away from the fixed measuring element.

17. The inspection device according to claim 12, further comprising:

a cover that is configured to cover a space between the pair of opposing surfaces when they are in a separated state.

* * * * *